(12) United States Patent
Parkhideh et al.

(10) Patent No.: US 11,982,693 B2
(45) Date of Patent: May 14, 2024

(54) SYSTEMS AND METHODS TO DETECT AND MEASURE THE CURRENT MISMATCH AMONG PARALLEL SEMICONDUCTOR DEVICES

(71) Applicant: University of North Carolina Charlotte, Charlotte, NC (US)

(72) Inventors: Babak Parkhideh, Charlotte, NC (US); Andreas Lauer, Charlotte, NC (US)

(73) Assignee: The University of North Carolina at Charlotte, Charlotte, NC (US)

( * ) Notice: Subject to any disclaimer, the term of this patent is extended or adjusted under 35 U.S.C. 154(b) by 202 days.

(21) Appl. No.: 16/598,457

(22) Filed: Oct. 10, 2019

(65) Prior Publication Data
US 2020/0116763 A1  Apr. 16, 2020

Related U.S. Application Data

(60) Provisional application No. 62/874,624, filed on Jul. 16, 2019, provisional application No. 62/744,358, filed on Oct. 11, 2018.

(51) Int. Cl.
*G01R 15/20* (2006.01)
*H05K 1/18* (2006.01)

(52) U.S. Cl.
CPC .......... *G01R 15/205* (2013.01); *H05K 1/181* (2013.01); *H05K 2201/10151* (2013.01); *H05K 2201/10166* (2013.01)

(58) Field of Classification Search
CPC .... G01R 15/205; G01R 15/20; G01R 15/202; G01R 19/0092; G01R 19/08; H05K 1/181; H05K 2201/10151; H05K 2201/10166
See application file for complete search history.

(56) References Cited

U.S. PATENT DOCUMENTS

| 7,515,434 B2 * | 4/2009 | Wyrzykowska ..... | H05K 1/0246 361/763 |
| 9,640,617 B2 * | 5/2017 | Das ..................... | H01L 29/1608 |
| 2004/0008470 A1 * | 1/2004 | Azuma ................ | H05K 1/0231 361/306.1 |
| 2006/0255793 A1 * | 11/2006 | Montreuil ............ | G01R 15/207 324/117 R |
| 2014/0333301 A1 * | 11/2014 | Racz ..................... | G01R 33/07 324/251 |
| 2018/0038898 A1 * | 2/2018 | Shimizu ................ | G01R 33/09 |

(Continued)

FOREIGN PATENT DOCUMENTS

DE  19748550 A1 * 10/1998 .......... G01R 15/207

OTHER PUBLICATIONS

Yang Xue "Active Current Balancing for Parallel-Connected Silicon Carbide MOSFETs", 2013, University of Tennessee.*

(Continued)

*Primary Examiner* — Son T Le
*Assistant Examiner* — Matthew W. Baca
(74) *Attorney, Agent, or Firm* — Loza & Loza, LLP; Michael I. Angert

(57) ABSTRACT

Apparatuses and methods of the present disclosure integrate a non-intrusive current sensor in the form of a current mismatch sensor into a power module having paralleled semiconductor structures or components. The current mismatch can be detected by the current sensor by monitoring a magnetic flux density between the paralleled components or devices.

18 Claims, 13 Drawing Sheets

(56) References Cited

U.S. PATENT DOCUMENTS

| | | | | |
|---|---|---|---|---|
| 2018/0306842 A1* | 10/2018 | Fukunaka | ............ | G01R 15/202 |
| 2020/0300894 A1* | 9/2020 | Brusius | .............. | G01R 19/0092 |
| 2021/0109132 A1* | 4/2021 | Brusius | ................ | G01R 15/207 |

OTHER PUBLICATIONS

Sørensen et al., "Conduction, reverse conduction and switching characteristics of GaN E-HEMT," 2015 IEEE 6th International Symposium on Power Electronics for Distributed Generation Systems (PEDG), Aachen, Germany, 2015 (Year: 2015).*

J. Lu, H. Bai, A. Brown, M. McAmmond, D. Chen, and J. Styles, "Design Consideration of Gate Driver Circuits and PCB Parasitic Parameters of Paralleled E-Mode GaN HEMTs In Zero-Voltage-Switching Applications," in 2016 IEEE Applied Power Electronics Conference and Exposition (APEC), Mar. 2016, pp. 529-535.

D. Kim, D. Joo, B. Lee, and J. Kim, "Design and Analysis of GaN FET-Based Resonant DC-DC Converter," in 2015 9th International Conference on Power Electronics and ECCE Asia (ICPE-ECCE Asia), Jun. 2015, pp. 2650-2655.

E. A. Jones, P. Williford, Z. Yang, J. Chen, F. Wang, S. Bala, J. Xu, and J. Puukko, "Maximizing the Voltage and Current Capability of GaN FETs In a Hard-Switching Converter," in 2017 IEEE 12th International Conference on Power Electronics and Drive Systems (PEDS), Dec. 2017, pp. 740-747.

Y. Wen, M. Rose, R. Fernandes, R. V. Otten, H.J. Bergveld, and O. Trescases, "A Dual-Mode Driver IC with Monolithic Negative Drive-Voltage Capability and Digital Current-Mode Controller for Depletion-Mode GaN HEMT," IEEE Transactions on Power Electronics, vol. 32, No. 1, Jan. 2017, pp. 423-432.

H. Li, X. Li, Z. Zhang, C. Yao, and J. Wang, "Design Consideration of High Power GaN Inverter," in 2016 IEEE 4th Workshop on Wide Bandgap Power Devices and Applications (WiPDA), Nov. 2016, pp. 23-29.

Y. Lei, C. Barth, S. Qin, W. Liu, I. Moon, A. Stillwell, D. Chou, T. Foulkes, Z. Ye, Z. Liao, and R. C. N. Pilawa-Podgurski, "A 2-kW Single-Phase Seven-Level Flying Capacitor Multilevel Inverter with An Active Energy Buffer," IEEE Transactions on Power Electronics, vol. 32, No. 11, Nov. 2017, pp. 8570-8581.

J. Choi, D. Tsukiyama, Y. Tsuruda, and J.M. R. Davila, "High-Frequency, High-Power Resonant Inverter with eGaN FET for Wireless Power Transfer," IEEE Transactions on Power Electronics, vol. 33, No. 3, Mar. 2018, pp. 1890-1896.

H. Li, X. Zhang, L. Wen, J. A. Brothers, C. Yao, K. Zhu, J. Wang, L. Liu, J. Xu, and J. Puukko, "Evaluation of High Voltage Cascode GaN HEMTs In Parallel Operation," in 2016 IEEE Applied Power Electronics Conference and Exposition (APEC), Mar. 2016, pp. 990-995.

J. L. Lu and D. Chen, "Paralleling GaN e-HEMTs in 10kw-100kw Systems," in 2017 IEEE Applied Power Electronics Conference and Exposition (APEC), Mar. 2017, pp. 3049-3056.

P. Liu, L. Zhang, A. Q. Huang, S. Guo, and Y. Lei, "High Bandwidth Current Sensing of SiC MOSFET with a Si Current Mirror," in 2016 IEEE 4th Workshop on Wide Bandgap Power Devices and Applications (WiPDA), Nov. 2016, pp. 200-203.

M. K. Das, C. Capell, D. E. Grider, S. Leslie, J. Ostop, R. Raju, M. Schutten, J. Nasadoski, and A. Hefner, "10 KV, 120 A SiC Half H-Bridge Power MOSFET Modules Suitable for High Frequency, Medium Voltage Applications," in 2011 IEEE Energy Conversion Congress and Exposition, Sep. 2011, pp. 2689-2692.

F. Xu, T. J. Han, D. Jiang, L. M. Tolbert, F. Wang, J. Nagashima, S. J. Kim, S. Kulkarni, and F. Barlow, "Development of a SiC iFET-Based Six-Pack Power Module for a Fully Integrated Inverter," IEEE Transactions on Power Electronics, vol. 28, No. 3, Mar. 2013, pp. 1464-1478.

S. J. Nibir, D. Fregosi, and B. Parkhideh, "Investigations on Circuits and Layout for Non-Intrusive Switch Current Measurements In High Frequency Converters Using Parallel GaN HEMTs," in 2018 IEEE Applied Power Electronics Conference and Exposition (APEC), Mar. 2018, pp. 2743-2748.

M. Biglarbegian, S. J. Nibir, H. Jafarian, J. Enslin, and B. Parkhideh, "Layout Study of Contactless Magnetoresistor Current Sensor for High Frequency Converters," in 2016 IEEE Energy Conversion Congress and Exposition (ECCE), Sep. 2016, pp. 1-5.

S. J. Nibir and B. Parkhideh, "Magnetoresistor with Planar Magnetic Concentrator as Wideband Contactless Current Sensor for Power Electronics Applications," IEEE Transactions on Industrial Electronics, vol. 65, No. 3, Mar. 2018, pp. 2766-2774.

M. Biglarbegian, S. J. Nibir, H. Jafarian, and B. Parkhideh, "Development of Current Measurement Techniques for High Frequency Power Converters," in 2016 IEEE International Telecommunications Energy Conference (INTELEC), Oct. 2016, pp. 1-7.

L. Jogschies, D. Klaas, R. Kruppe, J. Rittinger, P. Taptimthong, A. Wienecke, L. Rissing, and M. Wurz, "Recent Developments of Magnetoresistive Sensors for Industrial Applications," vol. 15, pp. 28 665-28 689, Nov. 2015.

W. Kim, S. Luo, G. Lu, and K. D. T. Ngo, "Integrated Current Sensor Using Giant Magneto Resistive (GMR) Field Detector for Planar Power Module," in 2013 Twenty-Eighth Annual IEEE Applied Power Electronics Conference and Exposition (APEC), Mar. 2013, pp. 2498-2505.

N. Troester, J. Ruthardt, M. Nitzsche, and J. Roth-Stielow, "Wide Bandwidth Current Sensor Combining a Coreless Current Transformer and TMR Sensors," in PCIM Europe 2018; International Exhibition and Conference for Power Electronics, Intelligent Motion, Renewable Energy and Energy Management, Jun. 2018, pp. 1-7.

C. Xiao, L. Zhao, T. Asada, W. G. Odendaal, and J. D. van Wyk, "An Overview of Integratable Current Sensor Technologies," in 38th IAS Annual Meeting on Conference Record of the Industry Applications Conference, vol. 2, Oct. 2003, pp. 1251-1258.

W. Kangping, M. Huan, L. Hongchang, G. Yixuan, Y. Xu, Z. Xiangjun, and Y. Xiaoling, "An Optimized Layout with Low Parasitic Inductances for GaN HEMTs Based DC-DC Converter," in 2015 IEEE Applied Power Electronics Conference and Exposition (APEC), Mar. 2015, pp. 948-951.

S. J. Nibir, S. Hauer, M. Biglarbegian, and B. Parkhideh, "Wide-Band Contactless Current Sensing Using Hybrid Magnetoresistor-Rogowski Sensor In High Frequency Power Electronic Converters," in 2018 IEEE Applied Power Electronics Conference and Exposition (APEC), Mar. 2018, pp. 904-908.

* cited by examiner

SYSTEMS AND METHODS TO DETECT AND MEASURE THE CURRENT MISMATCH AMONG PARALLEL SEMICONDUCTOR DEVICES

CROSS-REFERENCE TO RELATED APPLICATION

This application claims priority to U.S. provisional application entitled, "Methods to Detect and Measure the Current Mismatch among Parallel Semiconductor Devices," having Ser. No. 62/874,624, filed Jul. 16, 2019, which is entirely incorporated herein by reference, and U.S. provisional application entitled, "Methods to Detect and Measure the Current Mismatch among Parallel Semiconductor Devices," having Ser. No. 62/744,358, filed Oct. 11, 2018, which is entirely incorporated herein by reference.

STATEMENT REGARDING FEDERALLY SPONSORED RESEARCH OR DEVELOPMENT

This invention was made with government support under contract no. 1610250 awarded by the National Science Foundation (NSF). The government has certain rights in the invention.

BACKGROUND

Power modules are used for power conversion, and due to a wide range of power applications, one might be required to utilize parallel semiconductor structures or components in power modules, in order to achieve a specific power rating. A main objective of paralleling semiconductor devices or dies is to achieve higher current rating, as well as reducing the overall system on-resistance. To realize highly reliable power modules, the current distribution of each power electronic switch or transistor device in the power module and the total current of the power modules should be measured accurately in order to prevent current crowding, which can break the power semiconductor chip and/or shorten a power module's lifetime by partial heating. Moreover, an imbalanced distribution of circuit parasitic between paralleled devices can result in uneven power sharing leading to a degraded electrical and temperature performance by each of the paralleled devices. Therefore, it is essential to continuously monitor current sharing within paralleled devices of power modules in order to provide system prognostic and protection.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Increasing the efficiency and the reliability of power converters or modules is an important goal in power electronics. Apparatuses and methods of the present disclosure integrate a non-intrusive current sensor in the form of a current mismatch sensor into a power module having paralleled semiconductor structures or components. In various embodiments, to reduce the number of components and the circuit size, the current mismatch sensor is configured to measure or detect a current mismatch between the paralleled components in order to assess power module reliability. In one embodiment, the current mismatch can be detected by monitoring or measuring the magnetic flux density in between the paralleled components or devices. In various embodiments, such a shared current sensing power module circuit comprises Gallium Nitride (GaN) transistors or MOSFETs. In alternative embodiments, the shared current sensing power module circuit may comprise other semiconductor-based transistors, including Silicon transistors or MOSFETs.

GaN transistors as wide bandgap devices (WBG) have superior performance for their high breakdown electric field, low on-state resistance, fast switching speed and high working temperature, which results in power density improvement of GaN power modules or converters over Silicon power modules. To lower the conduction losses from GaN devices, the parallel configuration of GaN devices is commonly used. By assuring the symmetrical current sharing in parallel devices, the efficiency and reliability requirements for GaN paralleled devices are optimized. Thus, integration of a current mismatch sensor with paralleled components of a power module is a further step towards increasing the efficiency and reliability requirements for a power module in accordance with embodiments of the present disclosure.

Moreover, improvements in safe power module/converter operation and rate of degradation of the semiconductor materials within the power module are realized due to better circuit protection and reliability assurance.

Figure 1:
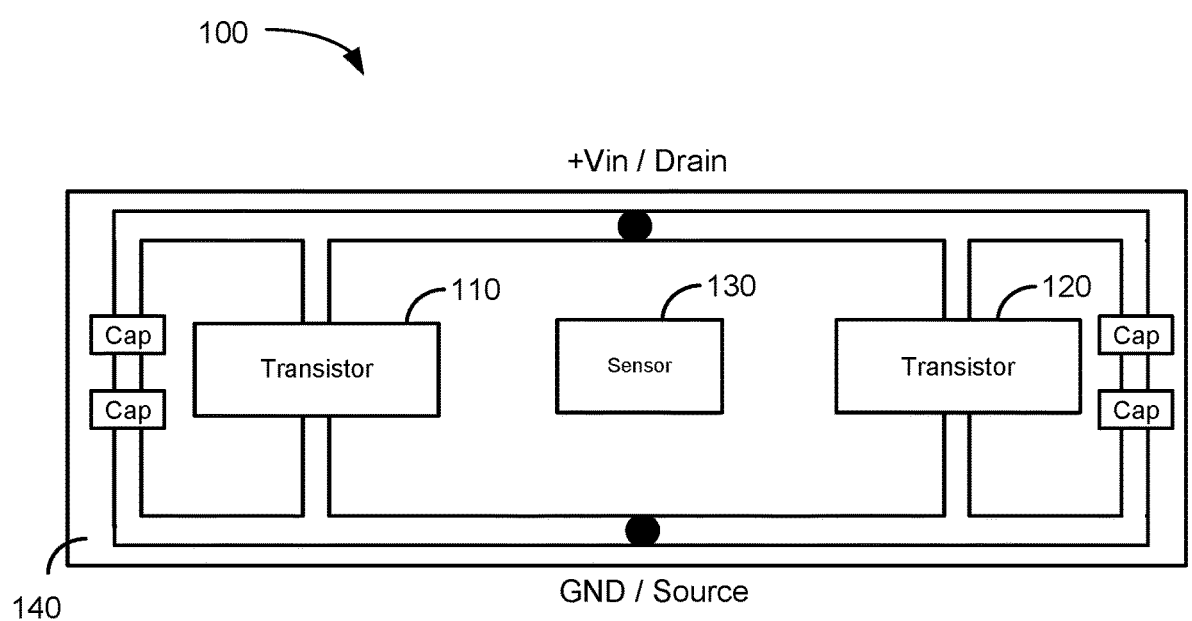
FIG. 1 shows an embodiment of a shared circuit sensing power module circuit in accordance with embodiments of the present disclosure.

Referring now to FIG. 1, an embodiment of a shared current sensing power module 100 in accordance with embodiments of the present disclosure is depicted. As shown in the figure, the exemplary module contains power transistors or switches 110, 120 positioned or mounted on a substrate 140 in a parallel configuration and a current mismatch sensor 130 positioned or mounted between or in proximity to the paralleled power transistors 110, 120 on the substrate 140 of a printed circuit board (PCB). Other circuitry such as gate drivers, power supplies, signal processing units, control circuits, etc. may be contained on external circuit boards and connected to a circuit board for the shared current sensing power module. In various embodiments, the current mismatch sensor 130 can measure one or more dimensions of the magnetic field.

The shared current sensing power module 100 is manufactured on, but not limited to, a ceramic substrate material in various embodiments. Advantages of ceramic substrate include good thermal and electrical characteristics and a cost-effective production, while the trade-off is that the board cannot be routed using four layers and vias. Accordingly, in various embodiments, the shared current sensing power module circuit 100 contains power electronics (power transistors and sensor(s)), while additional circuitry such as gate drivers, power supplies, signal processing units, control circuits, etc. are contained in secondary circuit boards.

As discussed, current information is typically required in power converters and inverters for reliability assurance, circuit protection, and control purposes. The simplest way to measure a current is an intrusive one, where the current flows through a resistor and the voltage is measured. This technique unfortunately comes with power loss and the introduction of undesired inductance, among other drawbacks. Since power efficiency in power converters is crucial, non-intrusive current measurement is preferred with power modules.

Embodiments of a shared current sensing power module in accordance with the present disclosure contain an array of power devices or components, such as transistors or switches (also referred as semiconductor dies) in a parallel configuration that share the total electric current. While electric current measurement is often done with magnetic sensors due to the varying current resulting in a magnetic field, magnetic sensors, such as a Hall-Effect sensors, are too bulky, expensive, and slow for high power modules. Thus, in accordance with the present disclosure, a current mismatch sensor is selected to be integrated with the power module that is significantly smaller than conventional magnetic current sensors. Embodiments of a current mismatch sensor in accordance with the present disclosure measures or detects a current mismatch among paralleled devices, such as switches (dies), rather than the total current passing through each power device.

In various embodiments, an exemplary current mismatch sensor detects a current mismatch in paralleled devices by monitoring or measuring the magnetic flux density between the paralleled components or devices. Accordingly, the current mismatch sensor can be magnetic field sensors, such as Magneto-Resistive (MR) sensors, Hall-Effect sensors, inductive sensors, embedded sensors in a power module, and other magnetic sensor technologies. Possible MR sensors include Anisotropic Magneto-Resistive (AMR) sensor, a Giant Magneto-Resistive (GMR) sensor, and a Tunneling Magneto-Resistive (TMR) sensor, among others. Accordingly, embodiments of a current mismatch sensor can include any available current mismatch sensor that can measure a current mismatch among power semiconductor dies within a respective power module. For example, the bandwidth of Hall-Effect sensors is limited to around 100-200 kHz which is not sufficient for wideband GaN transistors (since they can switch in the MHz range) but can be sufficient for Si and SiC transistors in various embodiments. Conversely, wideband MR current mismatch sensors are sufficient for GaN transistors in various embodiments.

Developing a power module having paralleled components with an integrated current mismatch sensor involves board level design considerations to minimize the loop inductances, while providing an accurate interface for the current signal detection process. Since imbalanced current distribution of the power module system could be caused by unequal distribution of system parasitic coupled to paralleled devices (e.g., transistors), it is vital to provide symmetric board layout with respect to switching devices, in order to equalize the current sharing of these paralleled devices. Unequal current sharing can result in inaccurate measurement of the switch currents.

Therefore, an exemplary shared current sensing power module circuit is designed with symmetric layout consideration. Instead of requiring a full rated current sensing element per switching device, embodiments of the present disclosure utilize current mismatch measurement topology in order to reduce the number of sensing elements, as well as each sensor required rating per application. Accordingly, in one embodiment, a novel GaN current sharing monitoring technique utilizes a commercially available z-axis Anisotropic Magneto-Resistive (AMR) sensor integrated between parallel GaN semiconductor devices.

Figure 2:
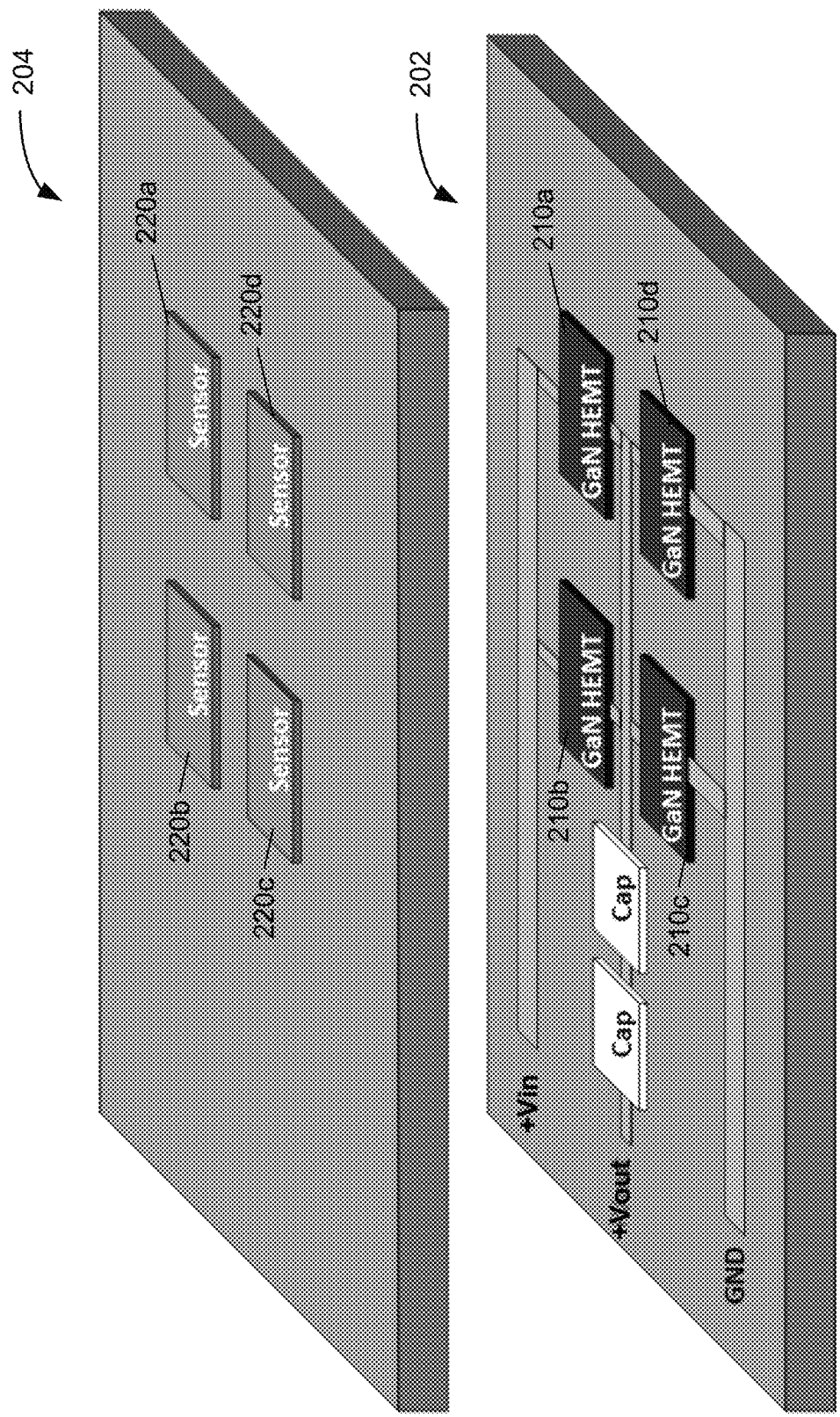
FIG. 2 shows a pre-existing power circuit board and separate sensor board in accordance with the present disclosure.

As a platform for testing operations of an embodiment of a pre-existing current monitoring power module (which will be used as a point of comparison with exemplary embodiments of the present disclosure), a synchronous buck converter, with two parallel GaN transistors or switches, is fabricated for testing purposes. For the power board, "GaN Systems GS66516B" transistors are used in the subsequent trials, which are 650V enhancement mode devices with a maximum current rating of 60 A, a drain-source on resistance ($R_{DS(on)}$) of 25 mΩ, and a capability of operating well above 10 MHz switching frequency. During testing, the initial board is manufactured on a 4-layer Printed Circuit Board (PCB) with the power devices 210 (e.g., GaN HEMT transistors) and driver circuits placed on the bottom side of a power board 202 and four current measurement sensor units 220 placed on a top side of a sensor board 204, as shown in FIG. 2. Each of the sensor units 220 is positioned or disposed to monitor an amount of current flowing through a respective one of the power devices 210.

The sensor board 204 is positioned at a top of the figure, while the power board 202 is positioned at a bottom portion of the figure. The GaN switches/transistors 220, AC capacitors, and the connectors are located on a bottom side of the power board that is visible in the figure. On the top side of the power board 202, which is not visible in the figure, gate driver, power supplies, etc. are located. Accordingly, to measure the switch current of the four GaN transistors 210a-d, the sensor board 202 features four commercially available anisotropic magnetoresistors (AMR) sensors 220a-d that are placed in a way that the positions of the sensors 220a-d are exactly above the switches 210a-d to measure the current as accurate as possible.

Computer Simulations

In this pre-existing layout of a high frequency GaN module/converter, the current path is simulated using the software COMSOL Multiphysics, which works by applying the "Finite Element Methods" (FEM). A FEM simulation of the designed circuit and layout was carried out to understand the distribution of the currents and the properties of the generated magnetic fields. These simulations were executable at high frequencies over 500 kHz and showed an unequal current distribution despite the symmetrical placement of the transistors for this pre-existing design layout.

Figure 3A:
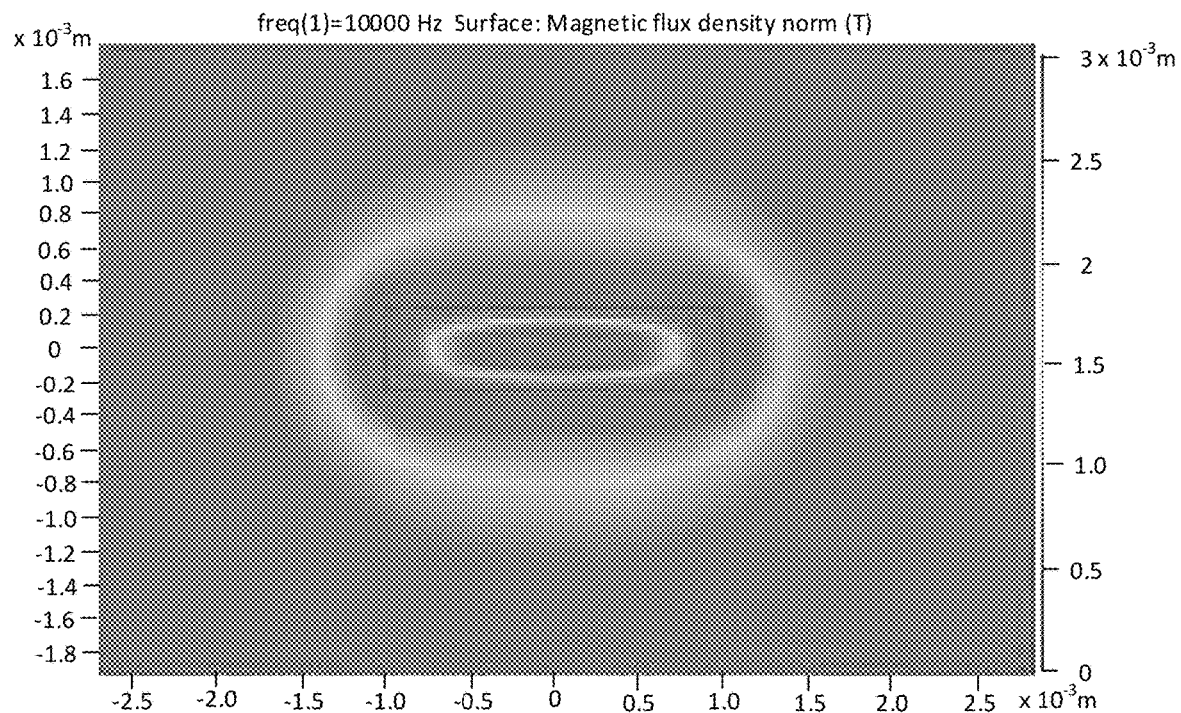
FIGS. 3A-3B show a magnetic flux density distribution of a 2D copper rectangle trace carrying an applied current of 20 A at 10 kHz and at 100 kHz using a 2D COMSOL simulation in accordance with the present disclosure.
Figure 3B:
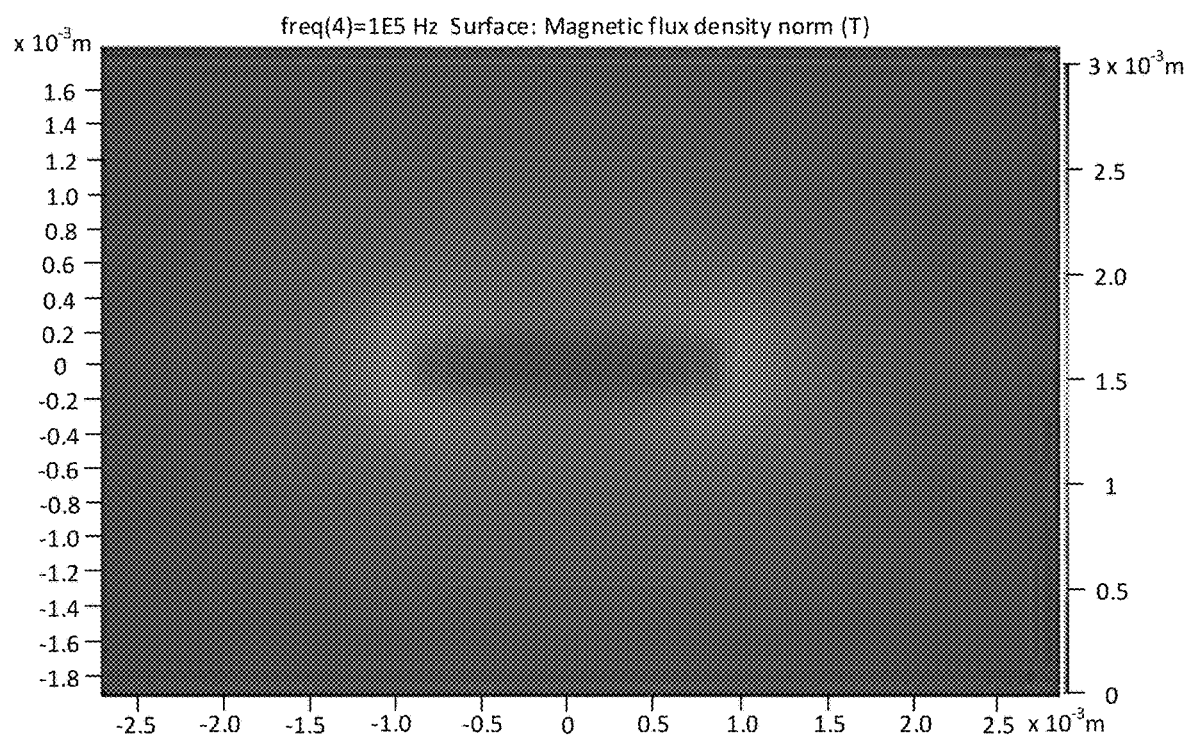

At the outset of testing, a 2D rectangle made from copper surrounded by air, with a current applied was simulated. FIGS. 3A-3B show the magnetic flux density distribution calculated for this case. This simple geometry was chosen to allow hands-on calculations using the Biot-Savart-Law. To simplify the calculations even more, only the magnetic field in some distance from the trace was analyzed and thus a round trace could be assumed. Under these conditions, the COMSOL simulations and the hands-on calculations accorded with each other very well at various distances as long as the frequencies were under 10 kHz, as shown in FIG. 3A. In the higher kHz and the MHz range, the simulation results varied significantly, as FIG. 3B depicts.

Next, the 2D case was extended to two parallel traces that conduct current. This case was analyzed by comparing simulation results with hands-on calculations from the interference of the two magnetic fields from both traces. It was found that the interference phenomenon is very well simulated with COMSOL as long as we do not observe high frequency behavior and as long as we are only interested in the magnetic flux density some distance away from the traces.

Figure 4A:
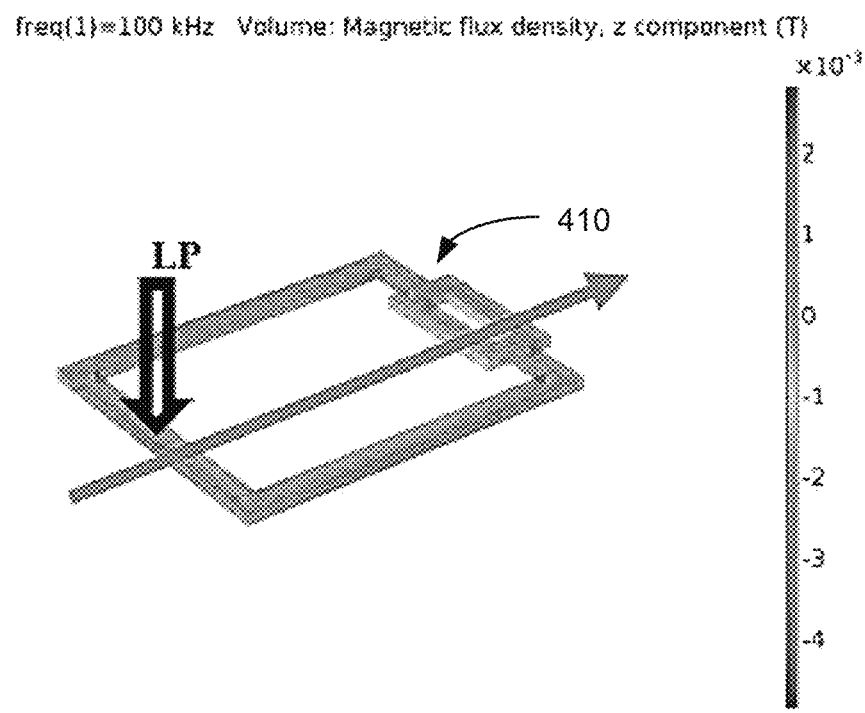
FIGS. 4A-4B shows a 3D COMSOL simulation of a geometry of a current carrying circuit with parallel traces and the magnetic flux density across the parallel traces in accordance with the present disclosure.
Figure 4B:
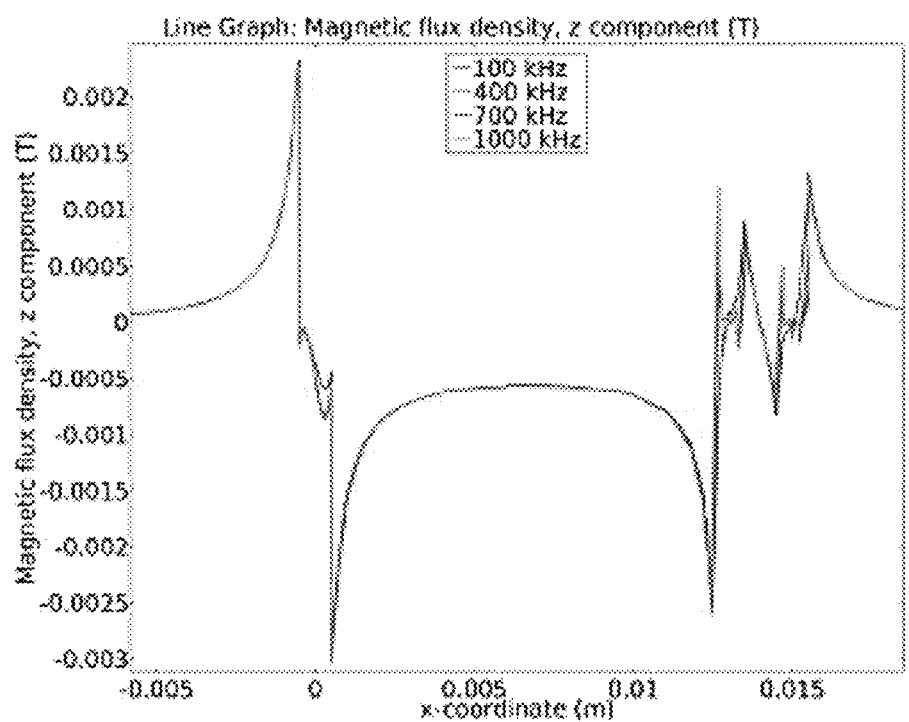

The next step was to change the geometry from 2D to 3D and to depict two parallel current carrying conductors. Accordingly, FIG. 4A shows a 3D geometry used for the simulation of two parallel current carrying conductors 410. As current input and output, the "Lumped Port" (LP) feature of COMSOL is used. Unfortunately, since the current does not flow through the middle of the trace, but along the inner edges, it is not optimally distributed between the two parallel traces, as FIG. 4B shows. This diagram (FIG. 4B) shows the magnetic flux density norm over the x-coordinate along the solid arrow in FIG. 4A. The first two magnetic flux density peaks that are originated around x=0 m can be derived from the current flowing out of the LP and show that the skin effect occurs in all considered frequencies.

In between, by the next peak, there is a positive magnetic flux density that comes from the fact that the current through the traces to and from the two parallel traces also result in a magnetic field and these two magnetic fields interfere in a constructive way. The peaks in between x=0.12 m and x=0.16 m are the ones that belong to the two parallel traces. It is obvious that the skin effect occurs and that the biggest amount of current flows along the inner edge of the inner trace despite the symmetrical design of the geometry.

An important finding, when the two parallel traces are observed, are the three minimal turning points in this area that are almost zero despite the unequal distribution of the current. The left and the right of these minimal turning points show the magnetic flux distribution in the middle of the current carrying traces, which is not surprising. However, the one in the middle is important as it shows the magnetic flux distribution between the two current carrying traces. Thus, this simulation shows that if the currents are not totally equal distributed between two parallel traces, the magnetic field density in the middle is only almost zero.

Thus, measurements of the magnetic flux density can be used to determine whether the currents in both arms are equal or not, assuming that the sensitivity of a chosen sensor is high enough. Moreover, as this diagram shows, the magnetic flux density becomes zero for all frequencies in between the two parallel traces and thus the bandwidth does not play a crucial role for current mismatch cases as compared to pure current measurement cases.

Figure 5A:
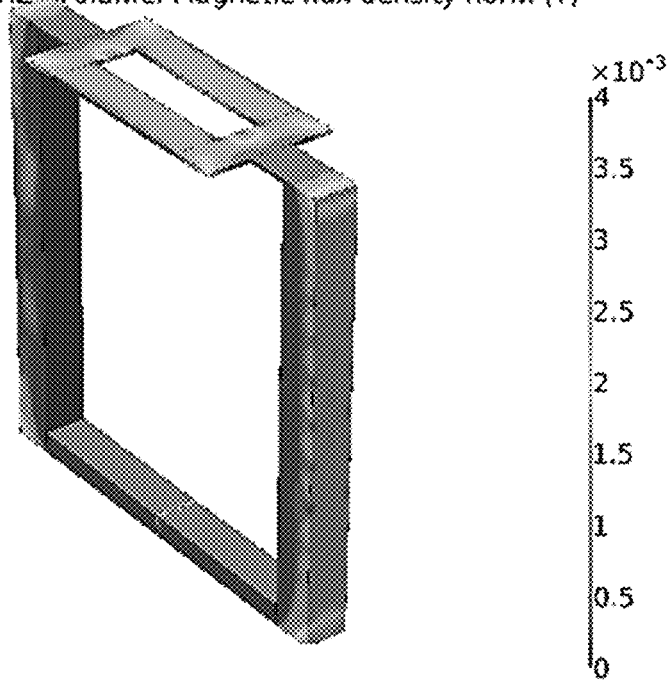
FIGS. 5A-5B show 3D COMSOL models of two paralleled traces that share the same excitation from both ends in accordance with the present disclosure.
Figure 5B:
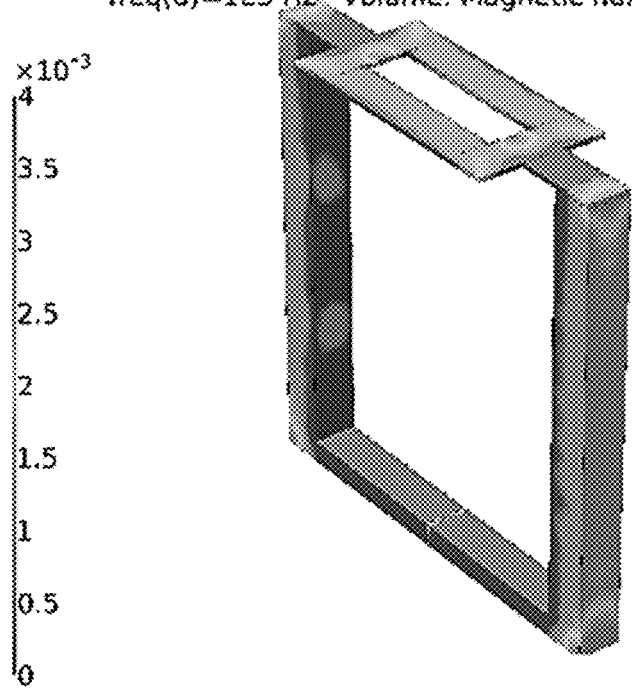

Referring now to FIGS. 5A-5B, two paralleled conducting GaN devices are modeled as two paralleled traces that share the same excitation from both ends. The simplified geometry, in FIGS. 5A-5B, is developed for the simulation of two parallel traces in 3D. In this geometry, the dimensions are adapted to the ones from real traces on the PCB. Moreover, the current input and output are located beneath the parallel traces to further improve the symmetry and to make the currents through the traces equal. With this modified symmetric circuit layout design, the two-dimensional current conduction of GaN devices provides a more predictable magnetic field created around the traces and are suitable to be integrated with point field detectors.

As was observed through FEA simulations, the magnetic flux density in between the two traces (x=14 mm) is almost zero for all frequencies, hence the current flowing through the traces is almost equally distributed. Thus, this location between parallel traces is suitable for measuring the current mismatch using a point field detector sensing element, since the variations of the magnetic flux density are minimal in the vicinity of this location and will minimize the impact of imperfect positioning of the sensor between the two paralleled GaN devices.

Experimental Results

Figure 6A:
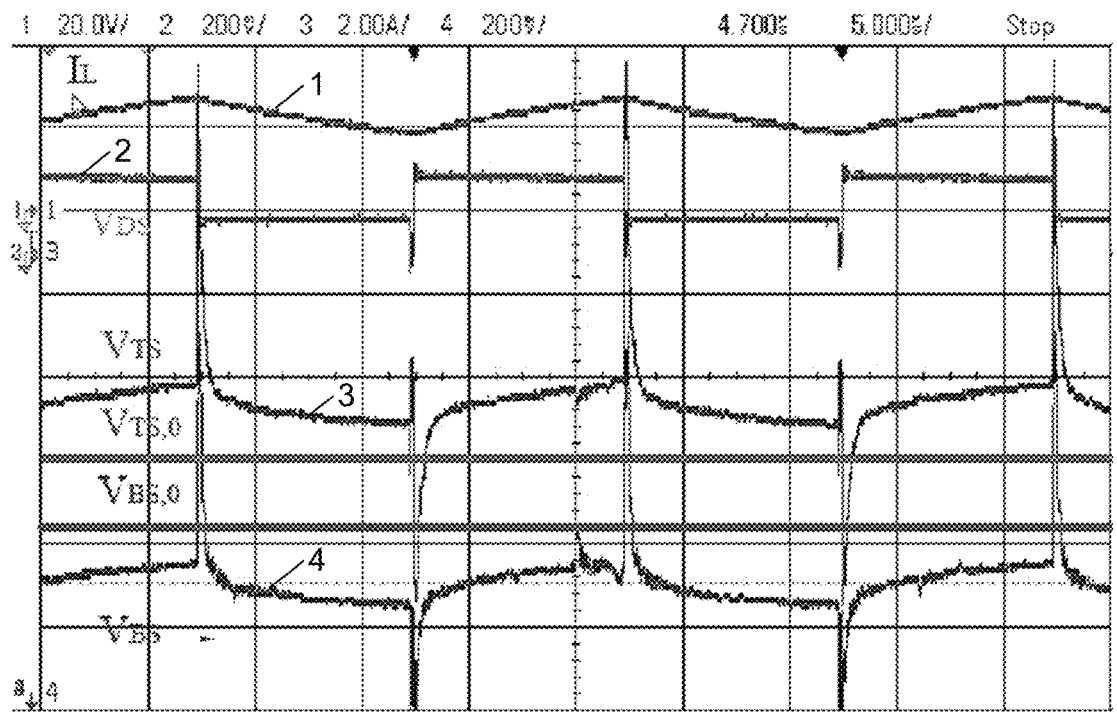
FIGS. 6A-6B show a distribution of magnetic flux density of the models of two paralleled traces of FIGS. 5A-5B at frequencies of 1 Hz and 10 kHz in accordance with the present disclosure.
Figure 6B:
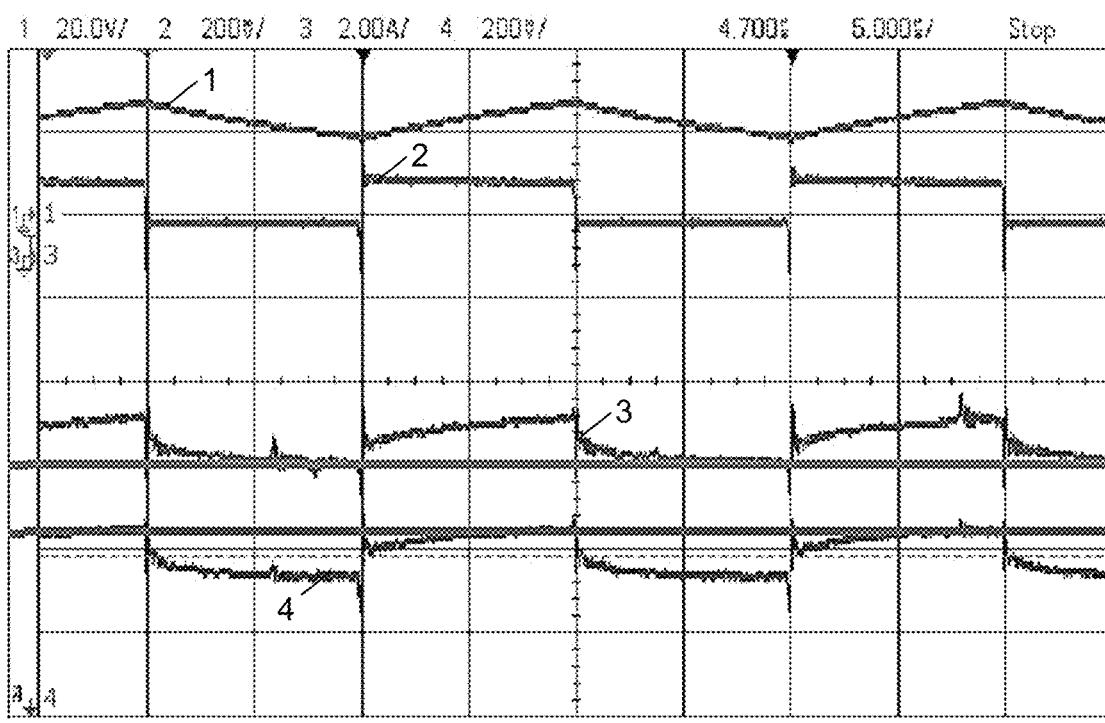

Using the pre-existing circuit boards of FIG. 2, various measurements are gathered and presented in FIGS. 6A-6B. In particular, FIG. 6A shows the measurements obtained with the left sensors (220b, 220c) and FIG. 6B shows the measurements obtained with the right sensors (220a, 220d). For the labeled lines or graphs in the figure, #1 is the bottom switch (210c, 210d) voltage, #2 is the load current measured with a current gun, and #3 is the output voltage of the top sensors (220a, 220b), and #4 is the output voltage of the bottom sensors (220c, 220d).

The labeled lines #3 and #4 show the sensors' output voltage in the no load case. For the current measured using the right sensors (220a, 220d) (FIG. 6B), the load current is shown to decrease when the top switch (210a) is OFF and is shown to increase when the top switch (210a) is ON. The bottom switch (210d) behaves vice versa, which can be seen from the #4 measurement in FIG. 6B.

When it comes to the discussion of the left sensors' measurements (FIG. 6A), the results look less promising. Neither the top (220b), nor the bottom (220c) sensors go down to the no load case value in OFF state, which rises the assumption that these sensors pick up a significant part of the load current. Moreover, the origin of the peaks is not known. The origin can possibly be switching noise or can be a byproduct of the current going in and out of the AC capacitors, which are closer to the left-hand sensors (220b, 220c).

Therefore, it is apparent that the left-hand sensors (220b, 220c) measure a considerable higher current, which confirms the assumption that the current is unequally distributed due to unsymmetrical power input and output connections in the preexisting design (FIG. 2). Moreover, the location of the AC capacitors may need to be assessed to decrease their influence on the magnetic field picked up by the left-hand current sensors (220b, 220c).

Based on the analysis of the problems evident with the pre-existing arrangement of power components, one embodiment of the present disclosure places power components, such as switches 110, 120, the power input and output connections (+Vin/Drain, GND/Source, etc.), and a current sensor 130 symmetrically on the same side (e.g., top side) of a circuit board. On the opposite side (e.g., bottom side), additional circuitry can be added as needed for a particular application.

Figure 7:
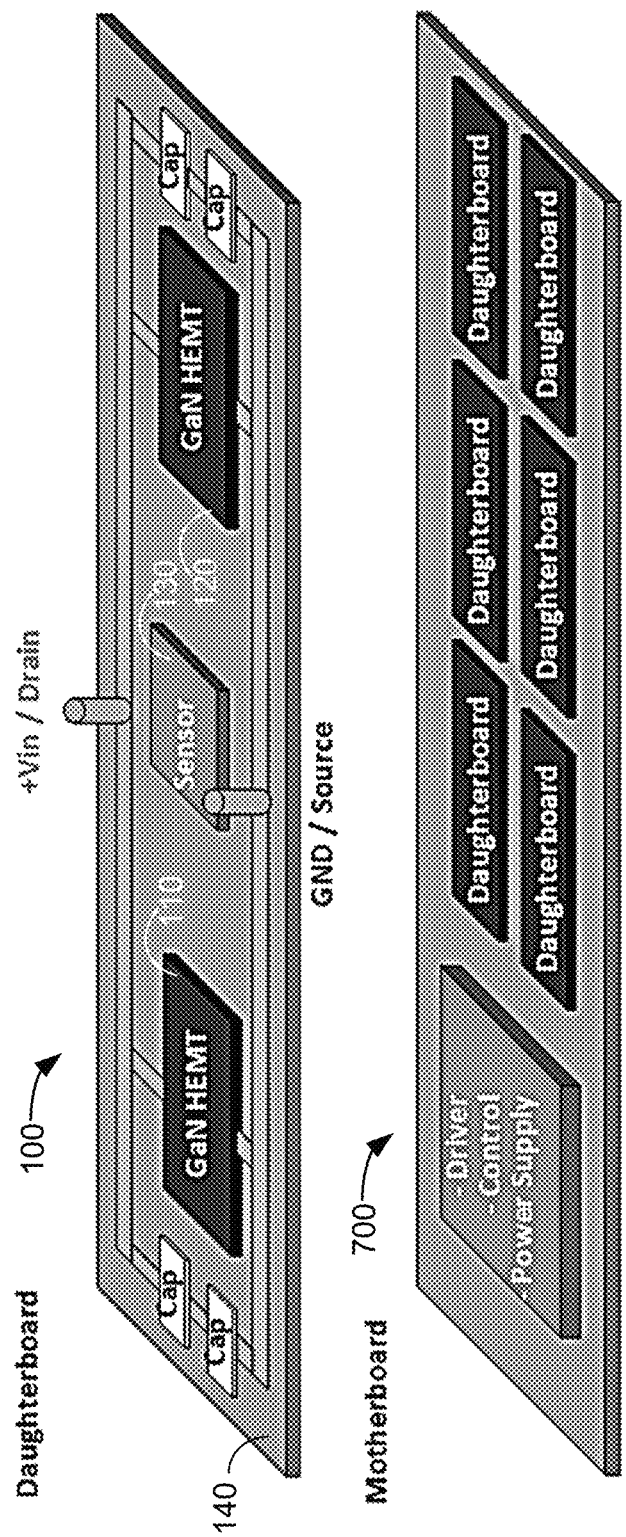
FIG. 7 shows an exemplary shared current sensing power module in accordance with embodiments of the present disclosure.

In an alternative embodiment, the additionally circuitry may be contained on a separate circuit board. For example, FIG. 7 shows an exemplary embodiment in which the circuitry is split up such that power components are located on a ceramic daughterboard that contains the power switches 110, 120 and current mismatch sensor 130, while a motherboard 700 comprises gate drivers, power supplies, signal processing units, control circuits and any number of daughterboards.

Further, in various embodiments, to equalize the current distribution and to reduce the influence of the high frequency AC capacitors' magnetic field on the magnetic field sensed with current mismatch sensor (e.g., AMR sensor), I/O connectors and/or capacitors are arranged in a symmetric location relative to the power components (e.g., GaN switches).

Figure 8A:
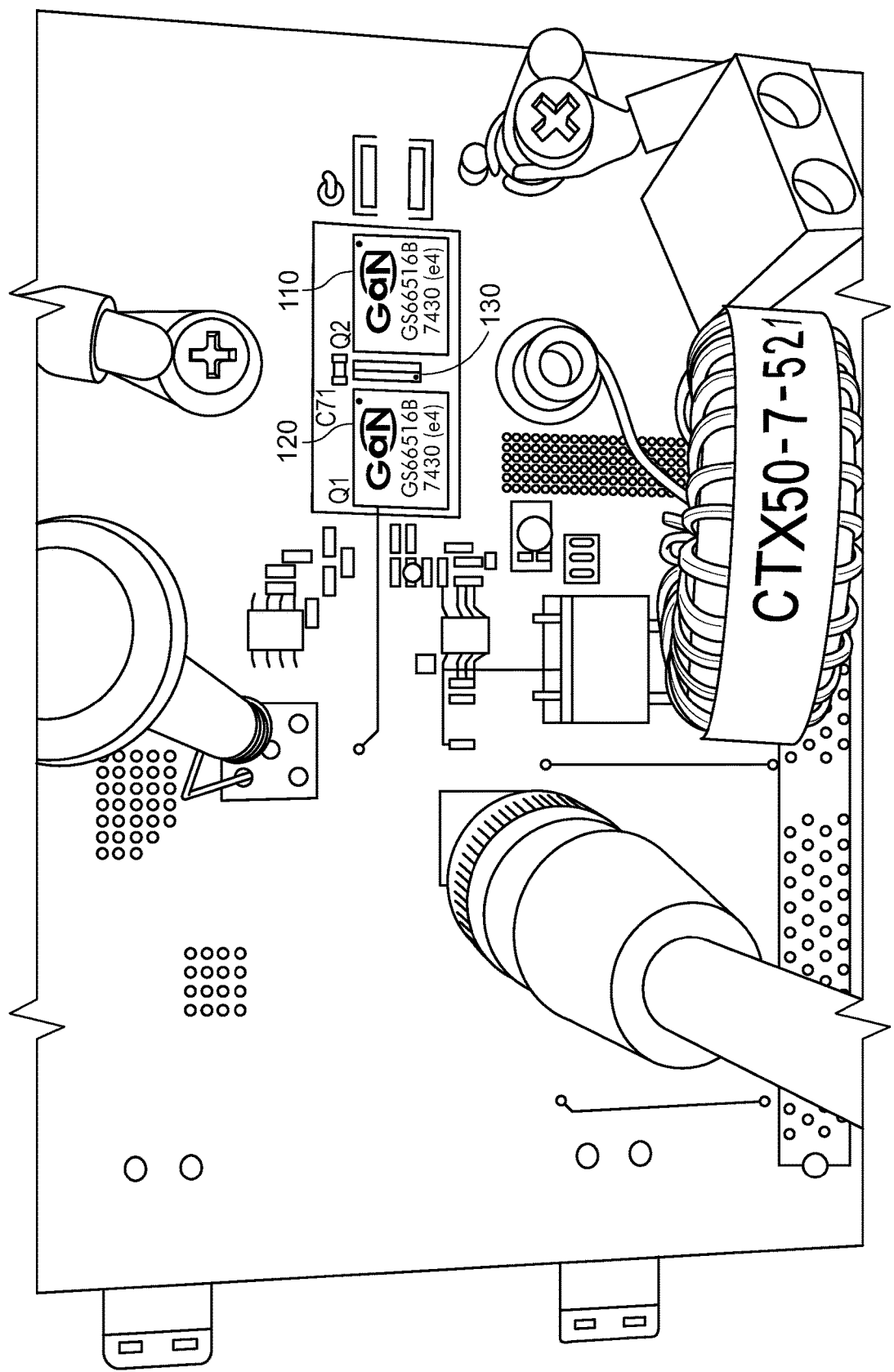
FIGS. 8A-8D show an additional exemplary shared current sensing power module and depictions of magnetic field distributions around paralleled power switches and resulting magnetic flux density's z-component between the paralleled power switches in accordance with embodiments of the present disclosure.

Using an exemplary sharing current sensing power module, as shown in FIG. 8A, various measurements are gathered and discussed below. For the power module, an integrated GaN converter, with two parallel GaN HEMTs 110, 120 and a current mismatch sensor 130, in the form of an AMR sensor, was fabricated on a circuit board, as shown in FIG. 8a. A magnetic field created around the two paralleled GaNs 110, 120 will have equal magnitude and opposite direction at every point that is equally distanced from each GaN device on their respective 2D current conduction plane based on the two dimensional electron gas (2DEG) characteristics of the GaN devices, as well as having symmetric current sharing between both paralleled devices. This destructive interference will lead to an output voltage value of the AMR sensor 130 being the same as in the case where no current is carried at all.

Figure 8B:
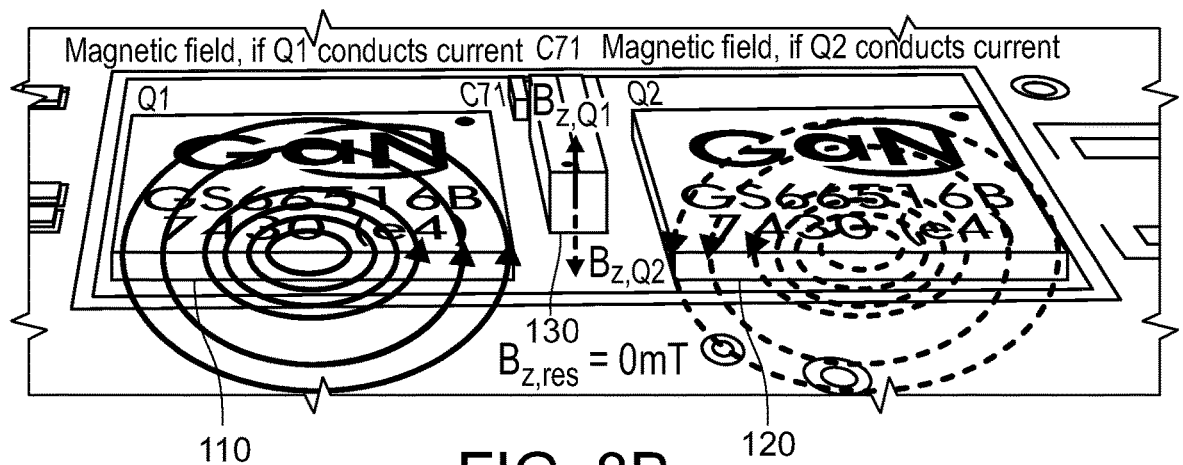
Figure 8C:
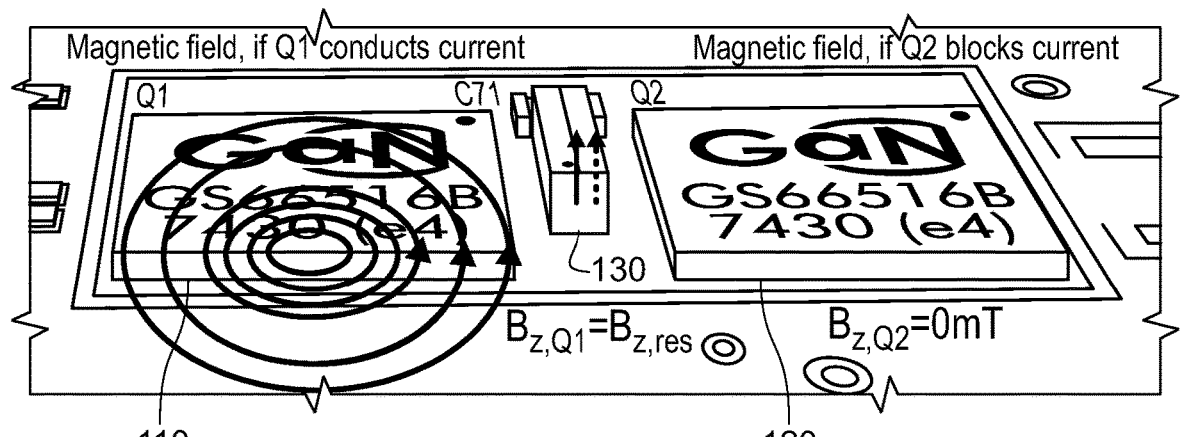
Figure 8D:
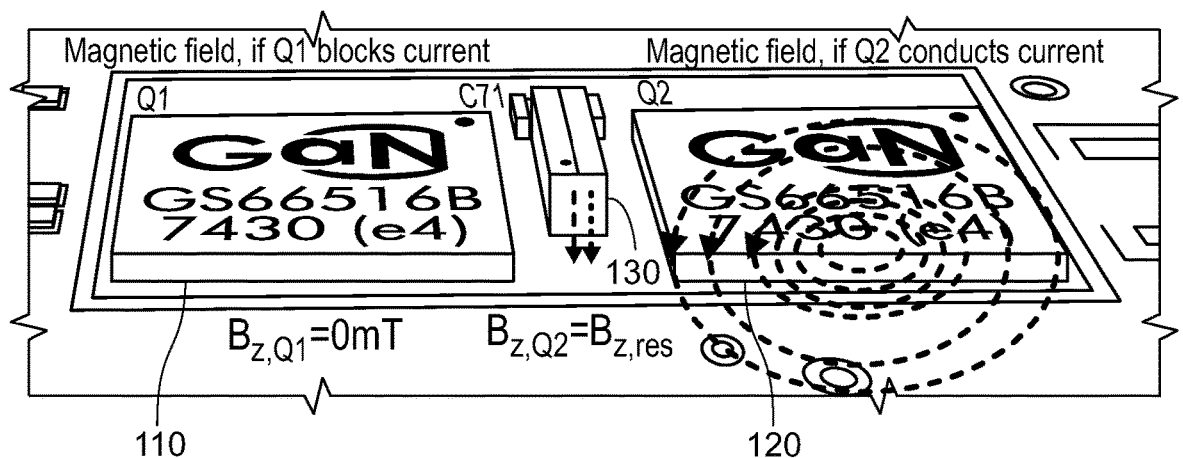

Accordingly, FIG. 8B depicts two sets of simplified magnetic field vectors around the transistors 110, 120 and the z-component of the magnetic flux density, where both currents carried through the transistors 120, 130 are equal. In FIG. 8C, only the left-hand transistor Q1, 110 conducts current, while Q2, 120 is turned off. In this case, the resulting z-component of the magnetic flux density is a result of the current carried through Q1, 120 and thus the current mismatch is greater than zero. A magnetic field greater than zero reduces the output voltage and thus the sensor's output voltage is observed to drop. In contrast, in the case depicted in FIG. 8D, only Q2, 120 conducts current and the output voltage increases. Thus, the resulting magnetic field equals the one that arises from the current through Q2, 120.

Figure 9:
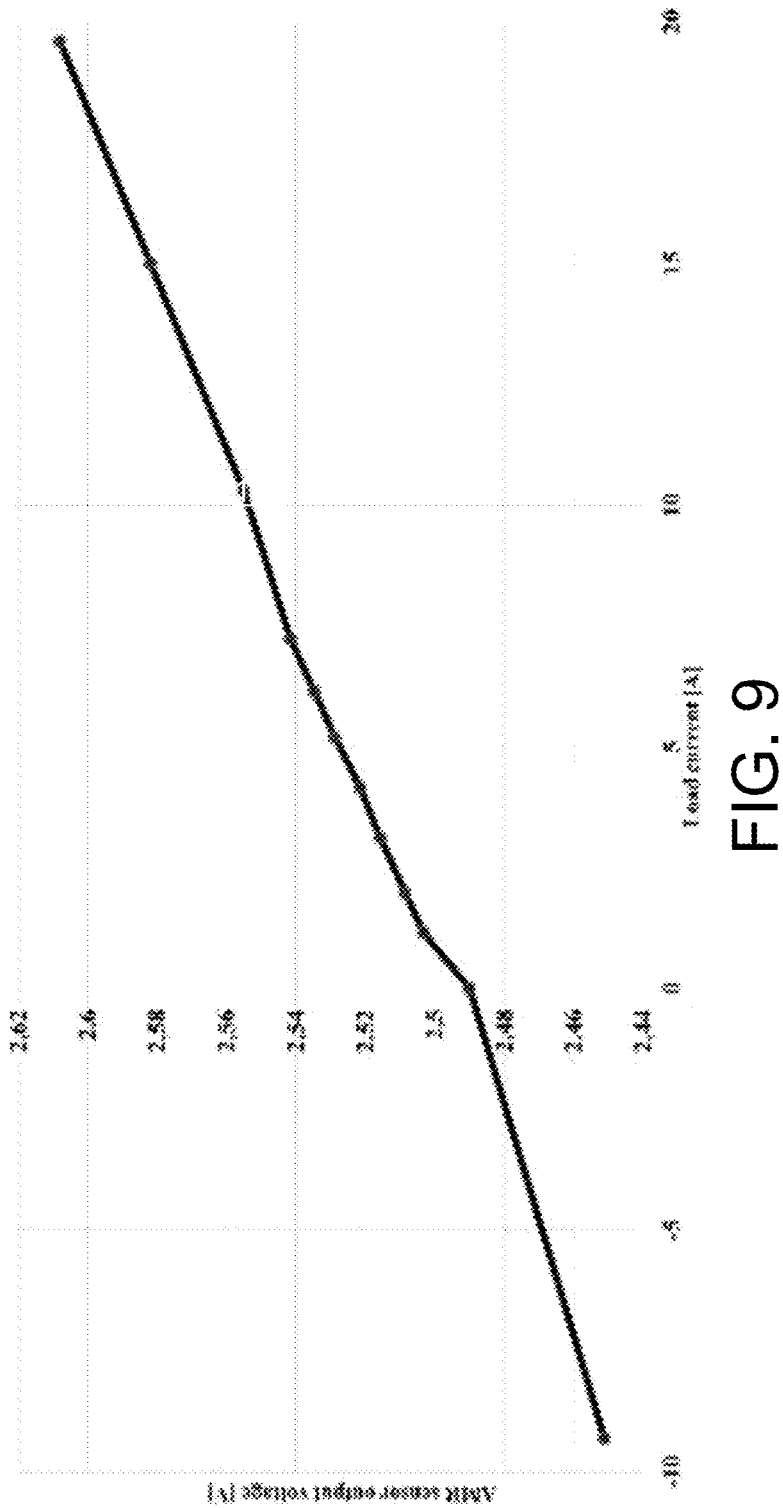
FIG. 9 shows the DC load current over an output voltage of the current mismatch sensor of FIG. 8A in the form of an AMR sensor.

Referring now to FIG. 9, an AMR current mismatch sensor was tested and characterized under various frequencies and current values. Measurements are obtained for the case when both transistors 110, 120 carry the current as well as the cases when only one transistor 110, 120 carries the current. The DC results presented in FIG. 9 show an almost linear dependency between current mismatch and AMR sensor voltage output, thereby verifying performance of the AMR sensor. From experimental measurements, the sensitivity of the current mismatch sensor 130 is observed to be about 25 mV/A. For calibration purposes, one may utilize the case where both transistors are carrying the same current as a reference value. Experiments with various frequencies as well as DC analysis supports this assumption. The analysis of the results confirm that GaN devices carry current in 2D and thus the current mismatch can be determined by measuring the z-component of the magnetic field. The resultant data, provided from the current mismatch sensor 130, can be used for prognostic and protection purposes.

Figure 10:
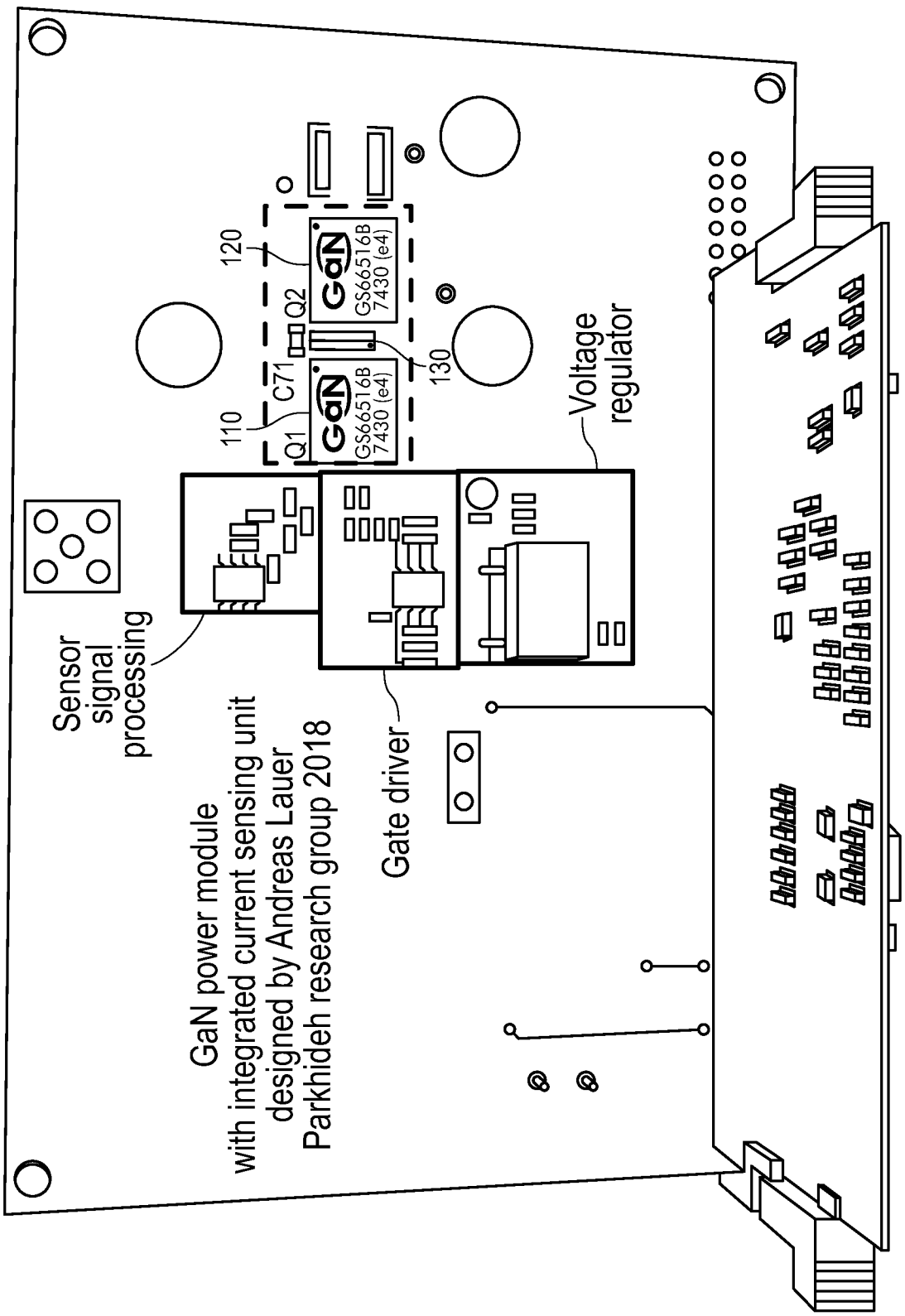
FIG. 10 shows an exemplary shared current sensing power module in accordance with embodiments of the present disclosure.

Next, FIG. 10 shows an embodiment of a shared current sensing power module, in accordance with the present disclosure. In particular, the figure shows a top side of the shared current sensing power module circuit board, in which GaN power module units are marked in a dashed box and additional circuits are marked in a solid box. As compared to the pre-existing design of FIG. 2, the two bottom switches 210c, 210d are replaced by a single SiC junction barrier schottky (JBS) diode. Measurements gathered with the exemplary GaN power module (FIG. 10) are presented and discussed below. FIGS. 11A-11D show four oscilloscope measurements of the exemplary power module circuit, where the line or graph labeled #1 shows the voltage over the JBS diode, the line labeled #2 shows the GaN transistors' voltage, line labeled #3 depicts the load current measured with a current gun, and the line labeled #4 shows the AMR sensor's output voltage. For the discussions, it is noted that the sensitivity of the AMR sensor HMC1051ZL is typically 1 mV/mT.

Figure 11A:
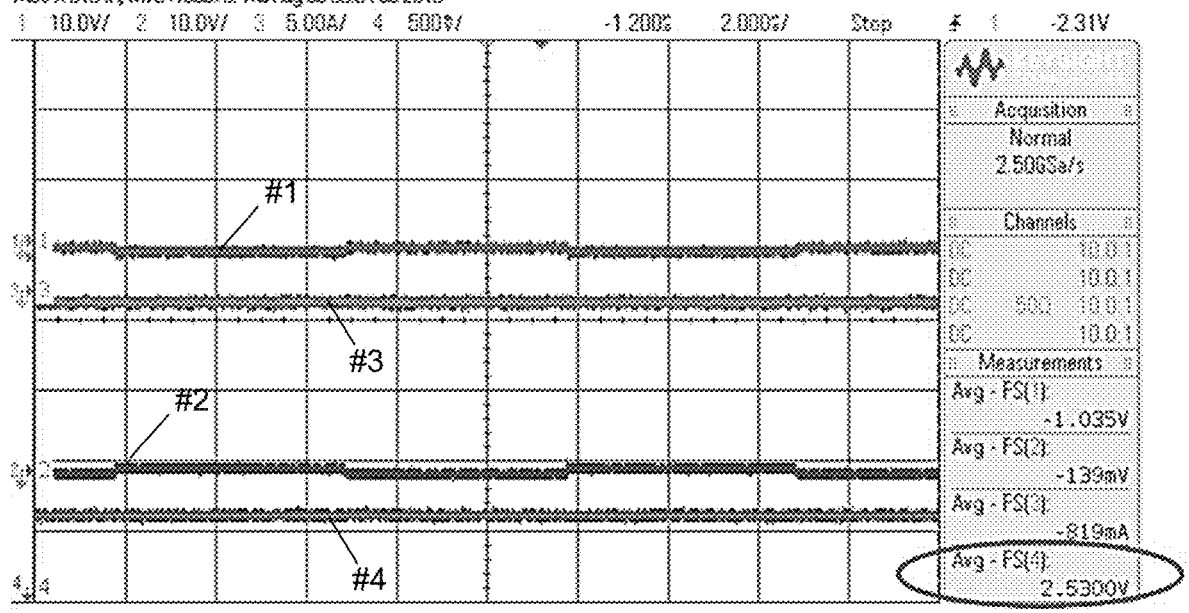
FIGS. 11A-11D show oscilloscope voltage and current measurements with the exemplary shared current sensing power module of FIG. 10.
Figure 11B:
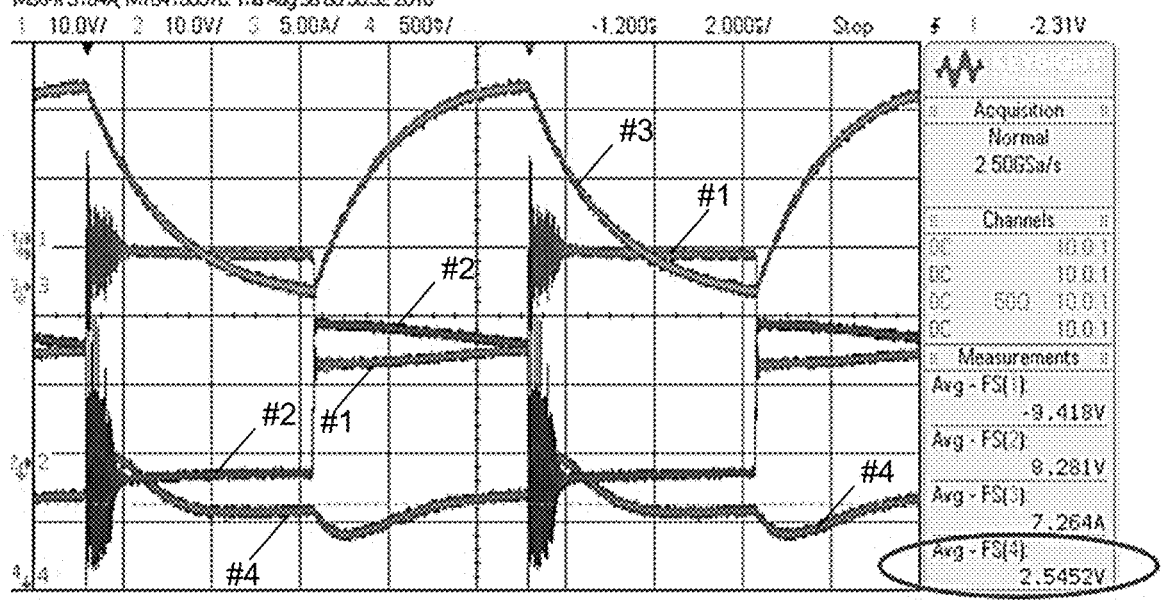

Correspondingly, FIG. 11A shows the case where no load and no input voltage is connected. This case is important to see if the assumptions that the currents are more equally distributed in the exemplary design (FIG. 10) than in pre-existing designs (FIG. 2). Next, FIG. 11B shows the case where a load is connected and the current is running through both of the transistors 110, 120. It can be seen that the current mismatch sensors' output varies slightly. One possible reason for the no load case resulting in 2.5300V output and the load case resulting in 2.5452V, may be attributed to switching noise. Further, an additional reason may be that a small difference in current is shared by the parallel transistors 110, 120. Upon comparing these measurements to the ones shown in FIGS. 6A-6B, it becomes apparent that the current distribution is significantly more equal. Moreover, thermal measurements were conducted that confirm this assumption. The 2.5452V value is marked with an ellipsis in FIG. 11B to serve as a reference value in the following discussions.

Figure 11C:
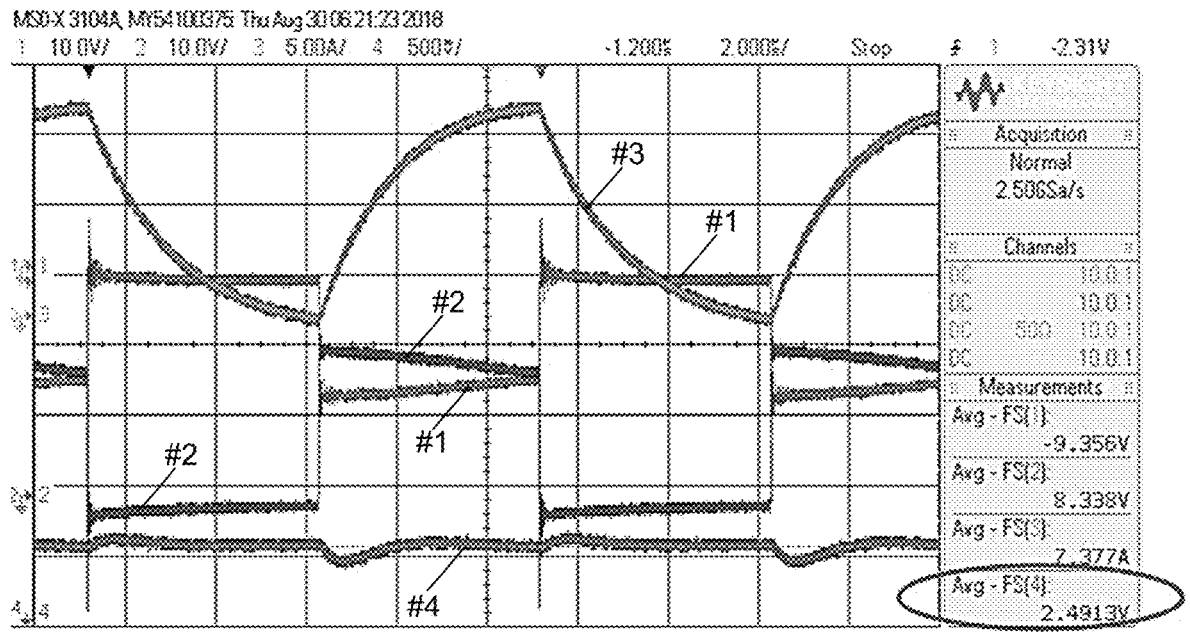

Next, FIG. 11C presents the case where only the left hand transistor 110 is switching. The measured average voltage of the current mismatch sensor 130 is 2.4913V, which is a difference of 53.9 mV to the reference case. Considering the sensitivity of the sensor, a magnetic field difference of 53.9 mT can be calculated.

Figure 11D:
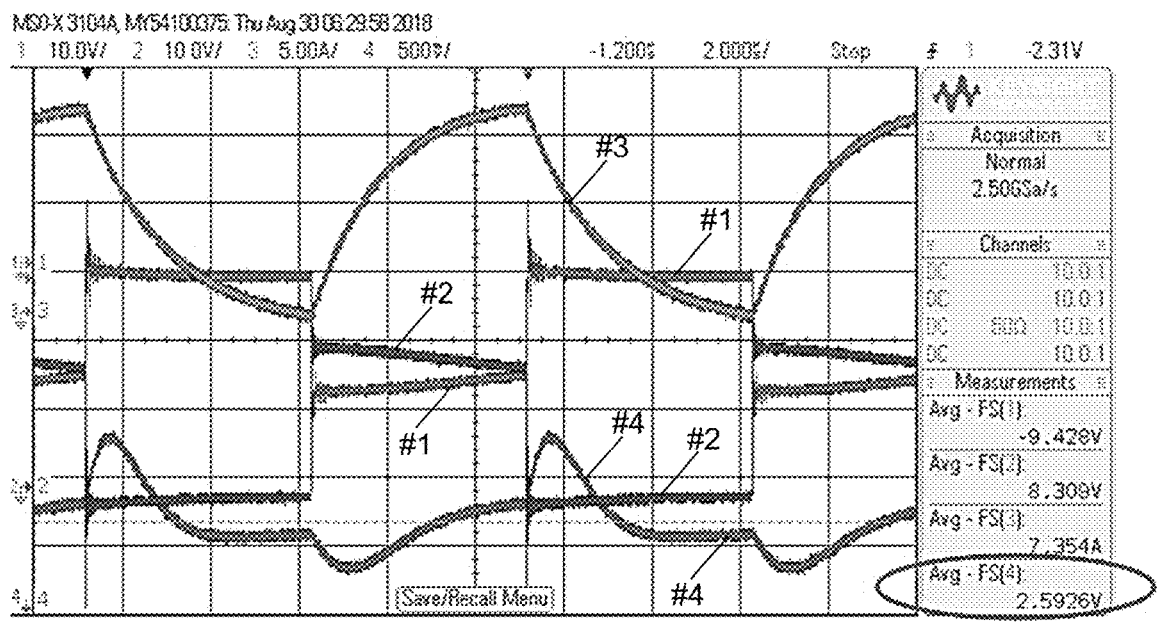

Correspondingly, FIG. 11D presents the case, where only the right hand transistor 120 is switching. The measured average voltage of the sensor 130 is 2.5926V, which is a difference of 47.4 mV to the reference case (2.5452V). Considering the sensitivity of the sensor, a magnetic field difference of 47.4 mT can be calculated.

A possible reason for the difference of 6.5 mT (=53.9 mV−47.4 mV) is a small inequality in the current sharing between the two parallel traces in the case where both transistors are switching, leading to a minor variation of the reference value. Another possible reason can be that the load currents in cases for FIGS. 11C and 11D are not exactly the same due to the imprecise power input. Apart from this small deviation the values are in an expected range, because using the simplified Biot-Savart-Law, currents in the range of 6

A-7 A can be calculated to be the origin of the measured magnetic fields. Further, the currents measured with the current gun are also in this range. Thus, based on experimental testing and analysis, performances of a shared current sensing power module in accordance with embodiments of the present disclosure have been verified and can be applied for reliability assurance and circuit protection for power electronics.

Based on major existing power electronics applications, current sensing is required in power modules for reliability assurance, circuit protection and control purposes. In accordance with the present disclosure, single chip contactless current mismatch sensors are integrated with paralleled semiconductor devices on a power module. In one embodiment, a novel current mismatch sensor (e.g., AMR sensor) is positioned or mounted between paralleled power switches or transistors (e.g., GaN transistors) and is configured to measure a current mismatch between the parallel power switches. Such shared current sensing power components are faster, smaller, and integrable with high power applications. Further, current sensing power control components in accordance with the present disclosure can provide various functions such as enhanced prognostics, protection, and control. For example, resultant data, provided from the current mismatch sensor 130 can be used for prognostic using artificial intelligence (AI) enabled hardware and/or protection of power electronics.

In various embodiments, an exemplary shared current sensing power module can be applied to multiple parallel devices. In general, since there are equi-magnetic-field points if an electric current is shared equally inside any power device module with parallel devices, any current mismatch can results in a change in the equi-magnetic-field points. Thus, positioning or inserting magnetic sensors (e.g., point field detectors/sensors) at these points allows for measuring the field changes and current mismatch consequently. Magnetic sensors can be discrete ones such as magnetoresistors or Hall-effect sensors and embedded sensors in a power module such as embedded coils and antenna in the substrate or the housing of the power module. Once the current mismatch is detected or measured, this information can be used for prognostics and predictive maintenance of the power module and/or the system where the module is used. The current mismatch measurements can be also used as a feedback to balance the current among parallel devices within the module, in accordance with embodiments of the present disclosure.

Various embodiments of power modules are described in the present disclosure. In one such embodiment in accordance with the present disclosure, a power module 100 comprises two or more power switching devices 110, 120 connected in a parallel configuration, in which the two or more power switching devices 110, 120 are collocated on a substrate 140. A magnetic current sensor 130 is mounted on the substrate 140 between the two or more power switching devices 110, 120, in which the magnetic current sensor 130 is configured to detect a current mismatch between the two or more or multiple power switching devices 110, 120 by monitoring a magnetic flux density between the multiple power switching devices. In various embodiments, capacitors and/or input and output connectors may also be positioned or disposed in a symmetric configuration around the multiple power switching devices 110, 120. In one embodiment, the magnetic current sensor detects the current mismatch by determining that a magnitude of a magnetic field at a first one 110 of the multiple power switching devices is not equivalent to a magnitude of a magnetic field at a second one 120 of the multiple power switching devices and/or determining that a direction of the magnetic field at the first one 110 of the multiple power switching devices is not opposite a direction of the magnetic field at the second one 120 of the multiple(s) power switching devices. In various embodiments, the magnetic current sensor 130 is configured to measure a z-component of a magnetic flux density attributed to the multiple power switching devices in the parallel configuration.

Various embodiments of methods of operation for the power module 100 are also described in the present disclosure. In one such embodiment in accordance with the present disclosure, the method includes positioning or disposing a magnetic current sensor 130 between two or more power switching devices 110, 120 that are in a parallel configuration on a substrate 140; and operating the magnetic current sensor 130 to detect a current mismatch between the two or more or multiple power switching devices 110, 120 by monitoring a magnetic flux density between the multiple power switching devices. In various embodiments, the method further includes positioning or disposing capacitors and/or input and output connectors in a symmetric configuration around the multiple power switching devices 110, 120. In one embodiment, the method includes detecting the current mismatch by determining that a magnitude of a magnetic field at a first one 110 of the multiple power switching devices is not equivalent to a magnitude of a magnetic field at a second one 120 of the power switching devices and/or determining that a direction of the magnetic field at the first one 110 of the multiple power switching devices is not opposite a direction of the magnetic field at the second one 120 of the multiple power switching devices. In various embodiments, magnetic current sensor 130 detects the current mismatch by measuring a z-component of a magnetic flux density attributed to the multiple power switching devices 110, 120 in the parallel configuration.

The foregoing discussions describes some, but not all embodiments of the present disclosure. Indeed, an exemplary shared current sensing power module and related components, systems, apparatuses, and methods may be embodied in many different forms and should not be construed as limited to the embodiments set forth herein; rather, these embodiments are provided so that this disclosure will satisfy applicable legal requirements.

In describing the present disclosure, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the present disclosure.

It should be emphasized that the above-described embodiments of the present disclosure are merely possible examples of implementations, merely set forth for a clear understanding of the principles of the disclosure. Many variations and modifications may be made to the above-described embodiment(s) without departing substantially from the principles of the disclosure. All such modifications and variations are intended to be included herein within the scope of this disclosure and protected by the following claims.

The invention claimed is:

1. An apparatus, comprising:
a substrate having a first side and a second side;
a first conductive trace on the first side;
a second conductive trace, different from the first conductive trace, on the first side; a pair of a same semiconductor die having respective bodies adjacent and proximal to the first side, and distal from the second side, the respective bodies defined by respective edges, each of the pair having at least a respective first terminal coupled to the first conductive trace and a respective second terminal coupled to the second conductive trace, the respective bodies of the pair and the respective first terminals and the respective second terminals physically oriented parallel to and spaced apart from one another, opposing ones of the respective edges defining a space between the pair, the pair configured to receive a current carried by the first conductive trace and split between the respective first terminal of each of the pair; and
a magnetic field sensor located in the space between the pair, adjacent and proximal to the first side, distal from the second side, without physically overlapping any portion of the pair, the first conductive trace, and the second conductive trace, the magnetic field sensor configured to sense a magnetic flux density within the space between the pair,
wherein the magnetic field sensor is magneto-resistive.

2. The apparatus of claim 1, wherein the magnetic flux density is representative of a difference between respective magnetic fields around each of the pair of the same semiconductor die, the difference between the respective magnetic fields being determinative of a current mismatch between the current split between the respective first terminal of each of the pair.

3. The apparatus of claim 1, wherein the magnetic field sensor is anisotropic.

4. The apparatus of claim 1, wherein the magnetic field sensor is a Hall-effect sensor.

5. The apparatus of claim 1, wherein the substrate is ceramic.

6. The apparatus of claim 1, wherein the same semiconductor die are GaN transistors.

7. The apparatus of claim 1, wherein the same semiconductor die are Si or SiC transistors.

8. The apparatus of claim 1, wherein the substrate and the pair of the same semiconductor die are parallel to an X-Y plane, and the magnetic field sensor is configured to sense a z-component of the magnetic flux density within the space between the pair, the z-component being perpendicular to the X-Y plane.

9. The apparatus of claim 1, wherein the magnetic field sensor is electrically isolated from the current carried by the first conductive trace and split between the respective first terminal of each of the pair.

10. The apparatus of claim 1, wherein the magnetic field sensor and each of the pair of the same semiconductor die is coupled to the first side of the substrate, the magnetic field sensor is located at a point equidistant from each of the pair of the same semiconductor die on the first side of the substrate and within the space between the pair, and is configured to sense respective magnetic fields of the respective pair in a z-axis, perpendicular to the first side of the substrate and within the space between the pair.

11. A method comprising:
obtaining a substrate having a first side and a second side, a first conductive trace on the first side, and a second conductive trace, different from the first conductive trace, on the first side;
coupling to the substrate a pair of a same semiconductor die having respective bodies adjacent and proximal to the first side, and distal from the second side, the respective bodies defined by respective edges, each of the pair having at least a respective first terminal coupled to the first conductive trace and a respective second terminal coupled to the second conductive trace, the respective bodies of the pair and the respective first terminals and the respective second terminals physically oriented parallel to and spaced apart from one another, opposing ones of the respective edges defining a space between the pair, the pair configured to receive a current carried by the first conductive trace and split between the respective first terminal of each of the pair; and
coupling a magnetic field sensor to the substrate, the magnetic field sensor located in the space between the pair, adjacent and proximal to the first side, distal from the second side, without physically overlapping any portion of the pair, the first conductive trace, and the second conductive trace, the magnetic field sensor configured to sense a magnetic flux density within the space between the pair,
wherein the magnetic field sensor is magneto-resistive.

12. The method of claim 11, wherein each of the pair of the same semiconductor die is configured as a respective switch, the method further comprising:
applying a voltage between the first conductive trace and the second conductive trace;
biasing each respective switch to an on state such that the current caned by the first conductive trace is split between the respective first terminal of each of the pair;
measuring, using the magnetic field sensor, the magnetic flux density in the space between the pair wherein the magnetic flux density is representative of a difference between respective magnetic fields around each of the pair of the same semiconductor die, the difference between the respective magnetic fields being determinative of a current mismatch between the current split between the respective first terminal of each of the pair.

13. The method of claim 11, wherein the magnetic field sensor is anisotropic.

14. The method of claim 11, wherein the magnetic field sensor is a Hall-effect sensor.

15. The method of claim 11, wherein the substrate and the pair of the same semiconductor die are parallel to an X-Y plane, and the magnetic field sensor is configured to sense a z-component of the magnetic flux density within the space between the pair, the z-component being perpendicular to the X-Y plane.

16. The method of claim 11, wherein the substrate is ceramic, the pair of the same semiconductor die are GaN transistors, and the magnetic field sensor is anisotropic magneto-resistive.

17. The method of claim 11, wherein the magnetic field sensor is electrically isolated from the current carried by the first conductive trace and split between the respective first terminal of each of the pair.

18. The method of claim 11, wherein the magnetic field sensor and each of the pair of the same semiconductor die is coupled to the first side of the substrate, the magnetic field sensor is located at a point equidistant from each of the pair of the same semiconductor die on the first side of the substrate and within the space between the pair, and is configured to sense respective magnetic fields of the respective pair in a z-axis, perpendicular to the first side of the substrate and within the space between the pair.

\* \* \* \* \*